United States Patent [19]
Henson et al.

[11] Patent Number: 5,471,176
[45] Date of Patent: Nov. 28, 1995

[54] GLITCHLESS FREQUENCY-ADJUSTABLE RING OSCILLATOR

[75] Inventors: James A. Henson, Morgan Hill; Scott E. Richmond, San Jose; William R. Akin, Jr., Morgan Hill, all of Calif.

[73] Assignee: Quantum Corporation, Milpitas, Calif.

[21] Appl. No.: 255,162

[22] Filed: Jun. 7, 1994

[51] Int. Cl.$^6$ .................................................. H03L 7/00
[52] U.S. Cl. .............................................. 331/1 A; 331/57
[58] Field of Search .............................. 331/1 A, 17, 34, 331/57, 45, 46, 48

[56] References Cited

U.S. PATENT DOCUMENTS

| | | | |
|---|---|---|---|
| 4,517,532 | 5/1985 | Neidorff | 331/57 |
| 4,884,041 | 11/1989 | Walker | 331/57 |
| 4,998,075 | 3/1991 | Patton, III et al. | 331/2 |
| 5,048,811 | 9/1991 | Lewis | 331/1 A |
| 5,061,907 | 10/1991 | Rasmussen | 331/57 |
| 5,087,842 | 2/1992 | Pulsipher et al. | 307/603 |
| 5,122,761 | 6/1992 | Wischermann | 331/1 A |
| 5,126,692 | 6/1992 | Shearer et al. | 331/8 |
| 5,136,260 | 8/1992 | Yousefi-Elezei | 331/17 |
| 5,191,301 | 3/1993 | Mullgrav, Jr. | 331/57 |
| 5,208,557 | 5/1993 | Kersh, III | 331/57 |
| 5,233,316 | 8/1993 | Yamada et al. | 331/45 |
| 5,241,429 | 8/1993 | Holsinger | 360/46 |
| 5,255,136 | 10/1993 | Machado et al. | 360/77.02 |

*Primary Examiner*—Robert J. Pascal
*Assistant Examiner*—David H. Vu
*Attorney, Agent, or Firm*—David B. Harrison

[57] ABSTRACT

A clock generation circuit includes a reference clock for putting out a stable reference clocking signal. A digital ring oscillator includes a series circuit loop having at least one inverting gate and a programmable delay line of plural delays formed a series of tapped digital transmission gates connected between an output and an input of the inverting gate. A multiplexer selects among the series of taps in accordance with a tap selection signal. A clock monitoring circuit is connected to compare the clock output with a stable reference clocking signal to produce a digital clock cycle count. A programmed microcontroller generates the tap selection value as a function of the digital clock cycle count and a desired clock output frequency set point. And, a synchronization circuit synchronizes tap selection value applied to the multiplexer in relation to the present, adjustable clocking signal, and to a logical state of a successor, adjustable clocking signal to be put out by the digital ring oscillator following the tap selection, in order to avoid glitches and without interrupting oscillation.

18 Claims, 6 Drawing Sheets

GLITCHLESS FREQUENCY-ADJUSTABLE RING OSCILLATOR

FIELD OF THE INVENTION

The invention relates to clock generators for digital electronics circuits. More particularly, the present invention relates to a frequency adjustable digital ring oscillator circuit structure for replication within a very large scale application specific integrated circuit array.

BACKGROUND OF THE INVENTION

A wide variety of electrical and electronic digital appliances require multiple internal clocks to synchronize and/or control internal processes. One exemplary appliance is a hard disk drive providing random access storage and retrieval of blocks of user data typically used by a host computing system. Within a disk drive, one clock may be provided to control operation of a microprocessor functioning as an embedded disk drive controller. Another clock may be used to regulate disk spindle speed. Yet another clock may be needed to control data transfer operations into and out of a cache buffer memory array. (In this regard, the clocking situation may be further complicated by the use of dynamic random access memory (DRAM) which requires periodic refreshing at a controlled refresh rate which may be slower than the actual data transfer rate). Yet another clock may be used for asynchronous peak detection of embedded servo information. One more clock may be needed to regulate data transfer rate between the disk drive and the host computer via a disk-host interface bus structure.

While a series of clocks are needed for proper functioning of the various processes, disk drive designs are undergoing on-going reductions in size and cost. A large scale integration of drive functions into one or a few application-specific integrated circuit (ASIC) semiconductor chips means that fewer and fewer external components, such as crystals, or crystal oscillator modules can be tolerated in size and cost reduced disk drive designs. Also, as data transfer rates continue to escalate, to rates as high as 40 to 100 Megabits or higher, onboard crystal oscillator circuits are increasingly difficult to realize with ASIC technology, with an undesired consequence that coveted circuit board space has been taken up with outboard, encapsulated, self contained oscillator modules available only at increased cost.

There have been prior approaches seeking to realize multiple clock generation within a single ASIC, based upon a stable reference crystal oscillator. However, those approaches have been complicated. One example is provided by U.S. Pat. No. 4,998,075 to Patton III, et al., entitled: "Programmable Multiple Oscillator Circuit". That patent described an arrangement in which a stored program included a value corresponding to each desired frequency. This value was compared with an actual value derived from each output frequency and used to adjust a voltage controlled oscillator providing the frequency.

Digital ring oscillators are known in the art. A ring oscillator may be formed of an interconnected ring of digital gates which includes therewithin at least one inverter gate, and sometimes, an odd number of inverter gates within the ring. A ring oscillator circuit has frequently been included within an ASIC as a test circuit in order to measure gate signal propagation delays of the particular ASIC design and/or layout, or to calibrate gate delays of signals propagating through the ASIC. Since ring oscillator test circuits are known ways to measure gate delays, they have been employed for that purpose in the prior art.

One prior example of an adjustable ring oscillator circuit for measuring the delay period of a delay circuit is described in U.S. Pat. No. 5,087,842 to Pulsipher et al., entitled: "Delay Circuit Having One of a Plurality of Delay Lines Which May Be Selected to Provide An Operation of a Ring Oscillator". The goal of the circuit described in that patent is to provide a controlled or calibrated delay line. It uses a ring oscillator circuit to determine actual delay of its own delay line. Once the actual delay of the oscillator ring is known, another delay line is adjusted by a crystal controlled microprocessor via a digital to analog converter. The FIG. 4 embodiment thereof suggests that delay line adjustment could be carried out by selecting delay taps via an 8 to 1 multiplexer.

Another example of a prior ring oscillator is described in U.S. Pat. No. 5,048,811 to Lewis, entitled: "Tuned Ring Oscillator". This patent is assigned to a disk drive manufacturer and describes a disk drive spindle frequency monitoring arrangement in which an adjustable ring oscillator is adjusted to the frequency of a disk spindle rotation signal, such as a once-per-revolution disk index signal. The described delay line architecture includes a series of transmission gates which requires as many control signals as there are taps.

A further example of a prior ring oscillator circuit is described in U.S. Pat. No. 5,241,429 to Holsinger, entitled: "Adaptive Prewrite Compensation Apparatus and Method". This patent, also assigned to the same disk drive manufacturer, describes a prewrite compensation circuit which is calibrated with the aid of a ring oscillator circuit structure formed within the same ASIC as also includes the prewrite compensation circuitry.

Other examples of digital ring oscillator circuits are found in U.S. Pat. No. 5,136,200 to Yousefi-Elezei, entitled: "PLL Clock Synthesizer Using Current Controlled Ring Oscillator"; U.S. Pat. No. 4,517,532 to Neidorff, entitled: "Programmable Ring Oscillator"; U.S. Pat. No. 4,884,041 to Walker, entitled: "Fully Integrated High-Speed Voltage Controlled Ring Oscillator"; U.S. Pat. No. 5,126,692 to Shearer et al., entitled: "Variable Frequency System Having Linear Combination of Charbe Pump and Voltage Controlled Oscillator"; U.S. Pat. No. 5,191,301 to Mullgrav, Jr., entitled: "Integrated Differential Voltage Controlled Ring Oscillator"; and, U.S. Pat. No. 5,208,557 to Kerrsh, III, entitled: "Multiple Frequency Ring Oscillator".

While ring oscillator circuits are generally understood, their performance is subject to at least three significant ASIC tolerances: power supply voltage fluctuations, ASIC temperature variations, and ASIC process variations from chip to chip. Because of these variations, ring oscillators have generally been deemed overly unstable and subject to frequency drift to be used as clocks for timing, controlling or regulating circuit processes and events.

Thus, a hitherto unsolved need has remained for an adjustable ring oscillator circuit for use within an ASIC for providing one of a plurality of frequency-regulated clocking signals for a digital electronics appliance, such as a hard disk drive, which may be readily adjusted in order to maintain a regulated frequency while in operation without glitches or interrupting oscillation, in order to compensate for frequency drift otherwise resulting from voltage, temperature, and/or process variations.

SUMMARY OF THE INVENTION WITH OBJECTS

One object of the present invention is to provide a frequency adjustable ring oscillator structure within an application specific integrated circuit in a manner overcoming drawbacks and limitations of the prior art.

Another object of the present invention is to provide a frequency-adjustable ring oscillator in which one may adjust the delay selection of the oscillator while it is oscillating without corrupting the oscillator's waveform.

A further object of the present invention is to provide one or more frequency adjustable ring oscillators and a single crystal controlled reference oscillator within a control environment requiring a plurality of different clocking signals.

One more object of the present invention is to provide programmable control of the frequencies of various clocks required by various functions of a mass storage device, such as a hard disk drive.

Yet another object of the present invention is to provide one or more frequency programmable ring oscillator structures in combination with a low cost external crystal reference oscillator which is less expensive than providing plural external crystal controlled clock oscillators for clocking a plurality of functions of an application specific VLSI circuit.

Still one more object of the present invention is to control some high speed functions of an application specific VLSI circuit with a frequency adjustable ring oscillator clock signal and other, lower speed functions with a precise crystal controlled oscillator clock signal.

Yet another object of the present invention is to develop and apply a Gray code control for controlling frequency adjustment of a ring oscillator structure in a manner enabling incremental frequency adjustments to be made without glitches, and without interruption of the resultant clocking signal.

Still another object of the present invention is to develop a low cost, general purpose frequency adjustable oscillator arrangement which may be readily included as a "library" function within an application specific integrated circuit design at relatively low cost, which enables realizing adjustable high frequency clocks at a cost and with circuit board space far below cost and space requirements for external high frequency crystal oscillator modules.

Yet another object of the present invention is to control frequency adjustment of an adjustable ring oscillator structure in a manner which corrects for delay element tolerances associated with voltage, temperature and process variations associated with an integrated circuit structure including the oscillator structure.

Still one more object of the present invention is to employ an embedded microprocessor of a mass storage device, such as a hard disk drive, to supervise, regulate and adjust frequency of one or more embedded, frequency adjustable ring oscillator circuits, based upon a reference oscillator circuit, thereby realizing a plurality of different clocks for use in controlling the mass storage device.

A clock generation circuit in accordance with principles of the present invention includes a reference clock putting out a stable reference clocking signal, a digital ring oscillator including a series circuit loop of at least one inverting gate, a programmable delay line comprised of plural delays formed of digital transmission gates connected in series in a path between an output and an input of the inverting gate, there being a series of taps along the plurality of digital transmission gates, and a clock output for providing a present, adjustable clocking signal. In this new clock generation circuit the programmable delay line comprises at least a first multiplexer for selecting among the series of taps in accordance with a tap selection value, clock monitoring circuitry connected to compare the clock output with the stable reference clocking signal and to produce a digital clock cycle count for each comparison made, a programmed microcontroller connected to receive the digital clock cycle count and to generate and put out a new tap selection value for controlling tap selection of the first multiplexer as a function of the digital clock cycle count and a desired clock output frequency set point, and a synchronization circuit for synchronizing the new tap selection value applied to the first multiplexer in relation to the present, adjustable clocking signal, and to a logical state of a successor, adjustable clocking signal to be put out by the digital ring oscillator following application of the new tap selection value.

In a preferred form, the clock generation circuit includes the first delay line to which the first multiplexer is connected to provide a coarse delay adjustment, and further includes a second delay line formed of plural digital transmission gates in series with the first delay line within the series circuit loop and a second multiplexer connected to taps along the second delay line for providing a fine delay adjustment. In this aspect of the invention, the synchronization circuit provides a first control path for controlling tap selection in the first multiplexer, and provides a second control path for controlling tap selection in the second multiplexer.

In a related aspect of the present invention the clock generation circuit further includes a Gray code encoding circuit in a control path between the programmed microcontroller and the synchronization circuit, for encoding the control value as a Gray code to control the programmable delay line, such that only adjacent tap positions are selected during a control interval, thereby precluding any possibility that a glitch will result in the adjustable clocking signal as a result of tap switching along the first delay line.

As a further facet of the present invention, an adjustable ring oscillator circuit is formed as one of a plurality of functions within a large scale digital integrated circuit. The ring oscillator includes an external reference frequency resonator means and a programmed digital microprocessor for controlling adjustment of frequency of the adjustable ring oscillator circuit. The integrated circuit includes:

- a reference clock connected to the external reference frequency resonator for generating and putting out a stable reference clocking signal,
- a series circuit loop of at least one inverting gate, a programmable delay line comprised of plural delays formed of digital transmission gates connected in series in a path between an output and an input of the inverting gate, there being a series of taps along the plurality of digital transmission gates, and a ring oscillator clock output for providing a present, adjustable clocking signal,
- at least a first multiplexer for selecting among the series of taps in accordance with a tap select control value,
- clock monitoring circuitry connected to compare the clock output with the stable reference clocking signal and to produce a digital clock cycle count for each comparison made,
- a synchronization circuit generating a tap switching control signal for synchronizing the tap select control value from the programmed digital microprocessor with the present, adjustable clocking signal, and with a logical state of a successor, adjustable clocking signal to be put out by the digital ring oscillator following the tap selection, and
- an interface for connecting the integrated circuit with the programmed digital microprocessor. The microprocessor is programmed so that it periodically receives the digital clock cycle count and generates and supplies the tap select control value for controlling tap selection of the first multiplexer via the interface to the synchronization circuit, the tap select control value being developed by the microprocessor as a function of the digital clock cycle count and a desired clock output frequency set point.

These and other objects, advantages, aspects and features of the present invention will be more fully understood and appreciated upon consideration of the following detailed description of a preferred embodiment, presented in conjunction with the accompanying drawings.

DETAILED DESCRIPTION OF THE PREFERRED EMBODIMENT

Figure 1:
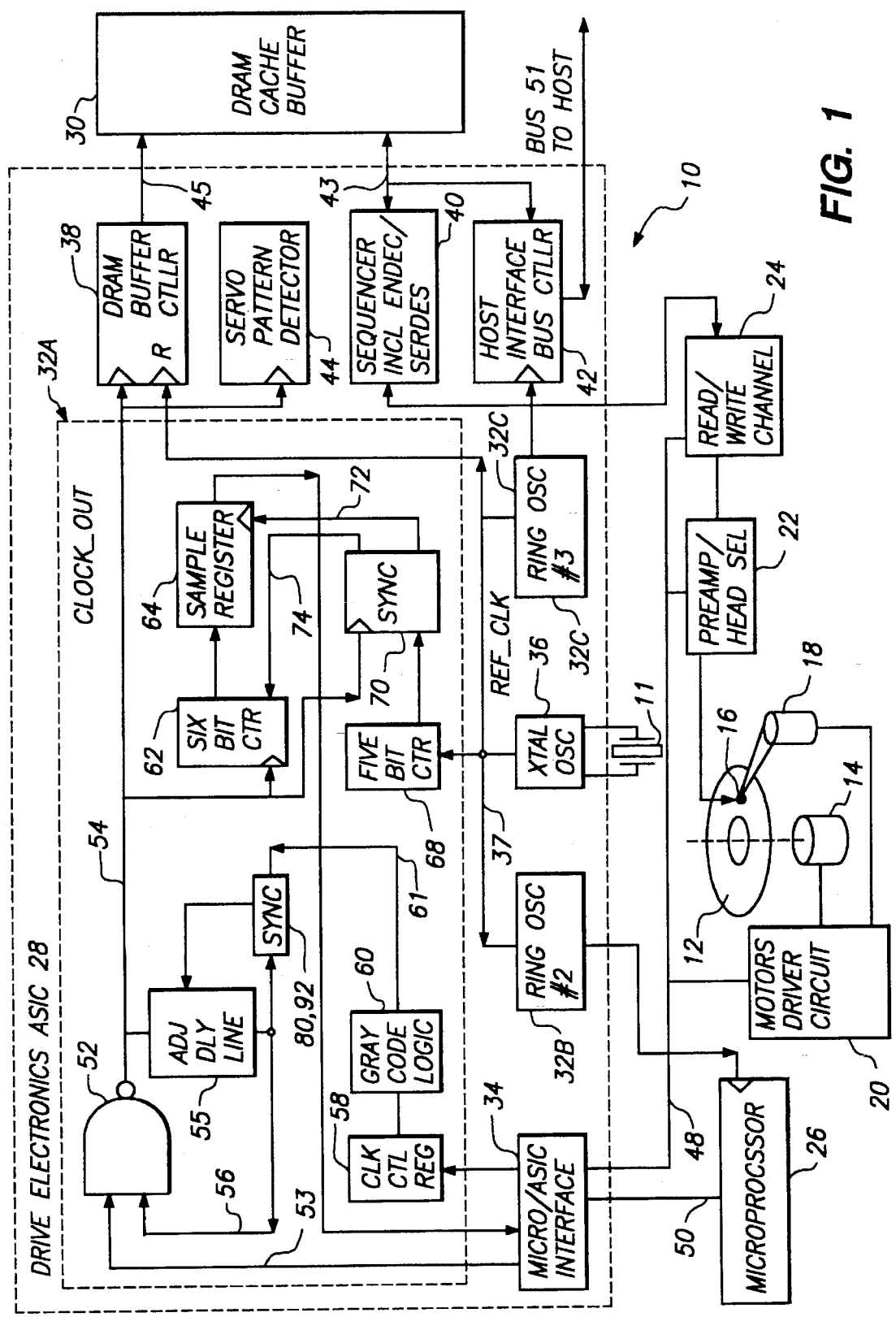
FIG. 1 is a block diagram of a hard disk drive including a frequency-adjustable ring oscillator in accordance with principles of the present invention.

In order to appreciate more fully the aspects and advantages of the present invention, an example is provided in FIG. 1 of a rotating magnetic disk data storage device, otherwise known as a hard disk drive. The hard disk drive 10 includes an on-board programmed digital microprocessor 26 functioning as an embedded disk drive controller. It also includes e.g. five other integrated circuit chips (ASICs) including a drive electronics ASIC 28, a DRAM cache buffer chip 30, a motor driver chip 20, a preamplifier/head select/write driver chip 22 and a read/write channel chip 24. A number of drive related functions are provided within the disk drive 10, and a number of separate clock signals having differing frequencies are advantageously employed to control and time these functions.

In order to save printed circuit board space, as well as cost, the disk drive 10 employs a single piezoelectric crystal device 11 in combination with a crystal oscillator 36 to generate a single, stable reference frequency, such as at e.g. 40 MHz. The crystal oscillator circuit 36 is formed as one function of the disk drive electronics ASIC 28. At least one, and if needed a plurality of, ring oscillators 32 may be included within the drive electronics ASIC 28 in order to generate one or a plurality of frequency-adjustable clocks. One of the oscillators, oscillator 32A, is shown in structural detail in FIG. 1, while the other oscillators 32B and 32C are each shown as a single block within the architecture of the electronics ASIC 28. Oscillator 32A is described in detail herein, and its structure and function are followed by the other oscillators 32B and 32C. If more clocks are needed, other oscillators may be readily included. With a gate-count-reduced design, each oscillator 32 requires about 589 gates of the drive electronics ASIC 28, which presently comprises e.g. about 30,000 such gates configured to provide the application specific functions ascribed thereto hereinafter. ASICs having higher densities and gate counts are clearly within the contemplation of the present invention, as integrated circuit processes continue to improve. Before describing the structure and function of oscillator circuit 32A, an architectural outline of the hard disk drive 10 is provided.

The disk drive 10 includes a rotating data storage disk 12 which is provided with a suitable e.g. thin film magnetic coating on the major surfaces thereof. Each data surface defines a multiplicity of concentric data tracks, although a single spiral track could be employed, if desired. The disk 12 is rotated at a constant predetermined angular velocity by a spin motor 14, which may be formed as an integral part of a rotating spindle assembly which mounts the disk 12 for rotation relative to a base (not shown). A suitable data transducer head 16 including a slider is mounted to a suitable gimbal and load beam, so that it is preloaded toward an associated data storage surface. The preload force is overcome by an air bearing formed when the disk is rotated relative to the head, as is conventional in Winchester flying head technology. Each head 16 and its load beam are secured to e.g. a rotary voice coil actuator 18 so that all heads 16 are positioned in unison at each selected data track location (called a "cylinder" when multiple heads are present) during track following, and are moved from a departure track to a destination track, by the rotary voice coil actuator structure 18. The spin motor 14 and the rotary voice coil actuator 18 are under the direct control of the motor control chip 20 which develops analog driving currents from signals supplied by a motor control circuit (not shown in FIG. 1) of the electronics ASIC 28 and, or by the microprocessor 26.

A preamplifier/write driver/head select circuit 22 is connected to each head 16 and functions to select a particular head during reading or writing, and to preamplify analog signals during reading, and to deliver digital writing signals to the head during data writing operations. A read/write channel ASIC 24 is connected to the circuit 22 and provides write precompensation during writing, and recovers a data clock and peak detects the incoming analog signals during reading. The programmed microcontroller 26 supervises all of the activities of the disk drive 10 and is connected directly to a microprocessor interface 34 within the drive electronics ASIC 28 via a bus structure 50. The microprocessor interface 34 enables the microprocessor 26 to have direct access to on-board registers including a sample register 64 and a clock control register 58 of each ring oscillator 28 in a manner to be described shortly. The microprocessor interface 34 also enables the microprocessor 26 to have access to the motor driver circuit 20, the preamplifier/head select ASIC 22, and the read/write channel 24 via a bus structure 48.

The disk drive electronics ASIC 28 includes the three ring oscillators 32A, 32B, and 32C, the microprocessor/ASIC interface 34, the crystal oscillator 36, a DRAM buffer controller 38, a sequencer 40 which includes an encoder/decoder (ENDEC) and a serializer/deserializer (SERDES), and a host interface bus controller 42 for enabling direct connection of the disk drive 10 to a bus level interface of a host computing system via a bus structure 51, such as SCSI or AT bus, or PCMCI, for example. A servo pattern detector 44 is also provided for detecting servo control patterns read by a selected head 16 from servo sectors embedded within the data tracks of the selected data surface. A further description of disk drive structure and functions is provided in commonly assigned U.S. Pat. No. 5,255,136 to Machado, et al., entitled: "High Capacity Submicro-Winchester Fixed Disk Drive" the disclosure thereof being incorporated herein by reference.

The ring oscillator clocking circuits 32A, 32B and 32C are also preferably included within the disk electronics ASIC 28, although they could be integrated into other ASICs of the disk drive 10. Each circuit 32 receives a reference clock over a path 37 from the e.g. 40 MHz single crystal oscillator circuit 36 (which is connected to the external crystal 11). The oscillator 32A provides an adjustable 50-60 MHz clock signal to a DRAM buffer controller 38, while the oscillator 32B provides an adjustable 32 MHz clock to the microcontroller 26; and, the oscillator 32C provides another adjustable clock to the interface bus controller 42, depending upon disk-host bus transfer rate.

The sequencer circuit 40, and the host bus interface controller circuit 42 are directly connected to a data bus 43 leading to the DRAM cache buffer 30. Address signals for addressing the DRAM cache buffer 30, including row address select (RAS) and column address select (CAS) signals which are used not only to address the DRAM cache buffer 30 but also periodically to refresh its memory cells, are applied via an address/refresh bus 45 by the DRAM buffer controller 38 to the DRAM buffer 30. It should be noted in the FIG. 1 example that a refresh clock (R) of the DRAM buffer controller 38 is not operated at the adjustable 50–60 MHz signal put out by the ring oscillator 32A. Rather, the refresh clock R is supplied by a stable reference clock, such as the 40 MHz crystal clock on the path 37 to a refresh counter within the controller 38, so that the DRAM cache buffer 30 may be refreshed at known, precise intervals, thereby assuring that the storage cells thereof are refreshed within the tolerance range (i.e. neither too soon, nor too late) of the particular chip implementing the cache buffer memory 30. While a crystal controlled reference frequency is shown applied to refresh the DRAM via the controller 38 in FIG. 1, an adjustable frequency ring oscillator in accordance with the present invention could be used for DRAM refresh, providing the oscillator has sufficient frequency regulation to operate reliably within the refresh window.

As shown in FIG. 1 an enable signal on a path 53 leads into one input of a NAND function 52 which puts out a CLOCK_OUT signal on the path 54. This signal is fed into an adjustable delay line 55. An output 56 of the adjustable delay line feeds back into a second input of the NAND structure 52. The NAND gate structure 52 provides at least one stage of signal inversion, (an odd multiple number of inverter stages also will work) and the delay line 55 provides the needed delay to sustain oscillation. Thus, the FIG. 1 arrangement constitutes a ring oscillator. In the FIG. 1 depiction, the inverter gate 52 is illustrated as a two-input NAND gate, with an input 53 providing an enable control line for enabling feedback oscillations to occur through the gate 52. Raising the line 53 creates an edge condition within the gate 52 and thereby triggers feedback oscillation of the loop at a rate determined in large part by the delay imposed by the adjustable delay line 55.

In this particular example 32A of the ring oscillator, the clock output line 54 provides a programmable/adjustable frequency lying in a range of e.g. 50 to 60 MHz. This signal is used e.g. to clock the DRAM buffer controller, and in turn, clock user data block transfers into and out of the DRAM 30 at an efficiently high frequency thereby speeding up overall user data block transfer rates.

Adjustment of the adjustable delay line structure 55 is under the direct control of the microcontroller 26, via the micro/ASIC interface structure 34 and the clock control register 58. Based upon actual timing samples held in the sample register 64, the microprocessor 26 periodically calculates and applies clock frequency adjustment values to the clock control register 58. A Gray code encoder 60 then encodes the control value held in the clock control latch 58 into a Gray coded control, and this value is then applied over a path 61 to adjust actual delay of the delay structure 55 without cessation of its oscillation, and without resulting in any unwanted glitches in the clock output on the path 54. When the delay structure 55 has been adjusted by the control value applied over the path 61, the frequency of the ring oscillator 32 changes. Other circuitry, now to be described, monitors actual clocking frequency, and provides a control feedback to the microcontroller 26.

The frequency monitoring structure includes a 6-bit (divide by 64) counter 62 which has a clock input connected to be clocked by the ring oscillator output clock on the path 54. An output from the counter 62 is applied as an input to a sample register 64. The sample register 64 is clocked at periodic intervals via a control on a clock line 72, and when clocked, the count then reached by the counter 62 is loaded into, and held by, the sample register 64 as a digital clock cycle count. Shortly after the digital clock cycle count is loaded into the sample register 64, the six bit counter is reset via a signal on a path 74.

The microcontroller 26 has a direct access path via the microcontroller interface 34 to the sample register 64 and may thereby periodically obtain each latched digital clock cycle count and calculate a difference value by taking the difference between the digital clock cycle count and a preloaded clock output frequency set point, within a predetermined range of frequency control granularity. The difference value is then converted by the microcontroller 26 into a new tap selection value. The new tap selection value is then loaded into the clock control register 58 via the interface 34 and thereafter used to adjust the taps of the adjustable delay line 55 in order to achieve equilibrium between the digital clock cycle count and the clock output frequency set point (i.e. difference value is zero). When the difference value is zero, no tap adjustment is needed, and no new tap selection value is put out.

It should be noted that the actual size of the counter 62 should be made sufficiently large to reach any count within the adjustment range without rolling over. In order to protect against roll over in the event the counter 62 is double clocked or triple clocked, the most significant bit position is "frozen" once it becomes set, until the counter is reset via the signal on the path 74. While the lower five bit positions will roll over, once set, the highest bit position maintains its logical value, thereby reducing significantly in magnitude any erroneous clock cycle count reached by the counter 62 in the event of a roll over condition. This precludes the microprocessor from attempting to adjust the CLOCK__OUT frequency from its proper nominal range to a very high frequency in error, for example.

A five bit (divide by 32) counter 68 receives the precise 40 MHz crystal controlled clock signal over the clock path 37 from the crystal oscillator 36. The counter 68 is connected to roll over to zero every time it reaches its maximum count value. Every time the five-bit counter 68 rolls over, its output is passed to a data synchronizer circuit 70 which synchronizes the count rollover value to the ring oscillator output signal on the path 54 to produce a synchronized roll-over output control which is fed directly to the sample register 64 in order to cause it to latch the count then present in the six bit counter 62.

The data synchronizer 70 comprises several flip-flops that synchronize the sample control signal with the CLOCK-OUT signal on the path 54. The objective of the data synchronizer 70 is to control when the six bit CLOCK__OUT counter 62 transfers the count it has reached into the sample register 64 and saves it for subsequent readout by the microprocessor 26. For example, an ideal count would be a 40 in order to generate 50 MHz. At 50 MHz, the sample counter 62 reaches a count of 40 when the reference counter 68 reaches its roll-over count of 32 counts of 40 MHz reference clock. The actual count reached by the sample counter 62 may be above, or below, 40, and the count value actually reached at reference counter rollover will be captured into the sample register 64 and held for the microprocessor 26 to read as it polls the clock 32A.

Once that count is safely transferred into and held in the clock sample register 64, a counter reset signal is put out by the synchronization circuit 70 over the path 74 in order to clear the six bit counter 62 and cause it to begin counting from zero with the next incoming ring oscillator clock pulse on the path 54. The value of 32 for the divisor is chosen in light of the desired ring frequency (50–60 MHz). The number of counts that the ring oscillator six bit counter 62 will reach in an interval of 32 counts of 40 MHz REF__CLOCK on the path 37 achieves a frequency adjustment step resolution (granularity) of e.g. 0.5 nanosecond per step. Preferably, the nominal frequency output CLOCK_OUT on the path 54 is 50–60 MHz±5%. This frequency regulation tolerance is chosen because it is not practical to control the ring oscillator frequency with infinite precision, as the adjustment steps along the delay line are limited in number (granular).

As explained above, the control algorithm implemented within the microprocessor 26 periodically determines from each clock cycle count value retrieved from the sample register 64 whether the CLOCK_OUT signal is above nominal frequency or below nominal frequency ("set point"). While the ring oscillator 32 need only be polled and adjusted if necessary, e.g. once per second in order to ensure reliable operation, in practice the microprocessor 26 will retrieve the clock cycle count value from the sample register 64 every e.g. 35 milliseconds. The particular calculations performed by the microprocessor 26 are conventional and are not otherwise described herein in detail, other than to point out that they are ones of a number of background routines typically performed by the microprocessor 26 when it is not occupied with other more important tasks, such as controlling head position within the servo control loop or supervising transfer of data blocks between the disk 12 and the host via the host bus 52, host interface bus controller 42, DRAM cache buffer 30, sequencer 40, read/write channel 24, and preamp/head select circuit 22.

If the actual clock frequency is above nominal, a new tap selection value is generated and written by the microprocessor 26 to the clock control register 58, and the new value held in the register 58 will adjust tap selection in order to lengthen the delay line 55 and slow down the clock frequency. If the actual clock frequency is below nominal, a different tap selection value is calculated and written to the clock register 58 to select a tap to shorten the delay line and thereby speed up the clock frequency. The control algorithm causes the ring oscillator to start oscillating at the lowest available frequency (i.e. the slowest ring) and then commands increased oscillation frequency on the fly e.g. by incrementing by one tap step at a time. There are two control objectives for the ring oscillator 32. One is that the oscillator should not switch to a frequency that is higher than acceptable, because that could cause clocked circuits to fail. And, tap selection should not create any glitches, because glitches could also cause clocked circuits to fail.

It will be understood by those skilled in the art that the microprocessor 26 operates asynchronously with respect to the CLOCK_OUT clock signal on the path 54. Since there is asynchronicity between these two processes, it is conceivable that the microprocessor 26 will attempt to read the sample counter 64 at the very instant that it is being updated. In order to avoid this collision, a pipeline architecture is implemented within the sample register 64. This arrangement means that a one sample latency occurs in the control loop. When the microprocessor 26 reads the sample register 64 for the very first time after a system reset, that value is discarded. However, the process of reading the sample register 64 arms the pipeline, and a valid count is captured and held. When the microprocessor 26 reads the sample register 64 at the next sampling interval, the held value is read, and the sample register 64 is cleared and rearmed for the next sample, etc. Thus, there is always a one sample latency between the sample interval and the actual sample being read by the microprocessor 26.

Figure 2:
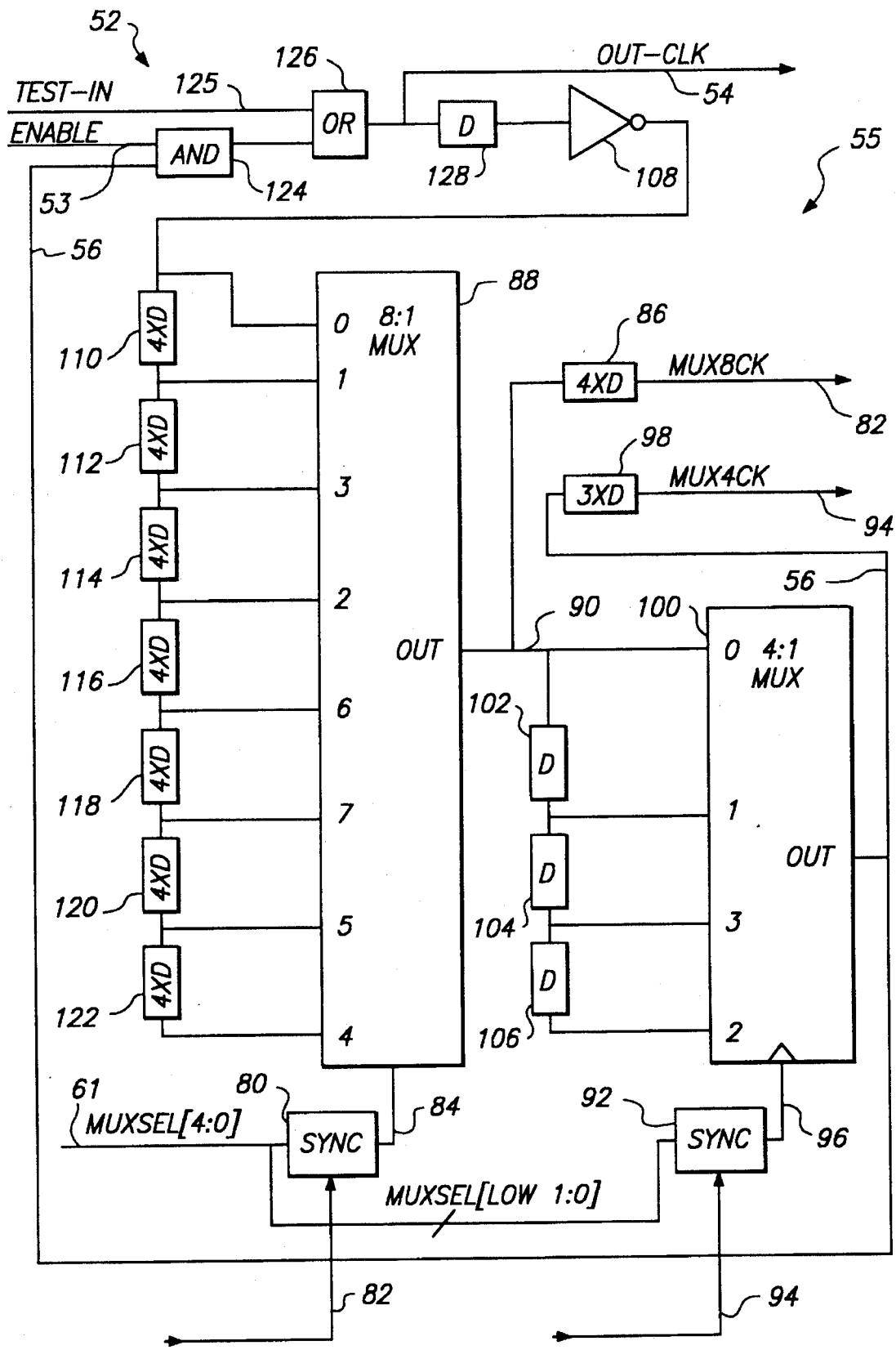
FIG. 2 is a more detailed block diagram of an adjustable delay line structure within the FIG. 1 ring oscillator.

With reference to FIG. 2, further details of the adjustable delay line structure 55 are depicted. In FIG. 2, three high order bit values [4:2] of the Gray-coded control on the path 61 are passed through a first synchronization circuit 80 which synchronizes these high order bit values of the Gray-coded control value to a MUX8CK signal incoming over a path 82. The MUX8CK clocking signal is developed as an output of a four times unit delay (4×D) 86 connected to an output path 90 of an 8:1 multiplexer 88. The synchronized high order bit values are applied to the multiplexer 88 in order to select one of eight available taps (0–7) thereof. As shown in FIG. 2, the taps are selected in consonance with the Gray-coded control, so that in order to select the third physical tap, (normally numbered 2), the Gray coded binary pattern (11b) for "three" causes that tap to be selected. Similarly, the fifth tap is selected by a "six" binary pattern, the sixth tap is selected by a "seven" binary pattern, the seventh tap is selected by a "five" binary pattern, and the eighth tap is selected by a "four" binary pattern.

The two low order bit values [1:0] of the Gray-coded control on the path 61 are passed through a second and different synchronization circuit 92 which synchronizes these low order bit values of the Gray-coded control to a MUX4CK signal incoming over a path 94. The MUX4CK clocking signal is developed as an output of a three times unit delay (3×D) 98 connected to the output path 90 of the multiplexer 88. The synchronized low order bit values are applied to select one of four outputs of a 4:1 multiplexer 100, having an output providing the ring oscillator feedback path 56, already described above. As with the 8:1 multiplexer 88, the 4:1 multiplexer taps are connected in consonance with the Gray code. Thus, the third tap is connected to be selected by a "three" binary pattern, while the fourth tap is selected by a "two" binary Gray-coded pattern.

Also, the lowest order two bit positions of MUXSEL[4:0] go through a different synchronization circuit 92 which is synchronized with MUX4CK which is generated by three times delay from the output of the 4:1 MUX. The 4:1 multiplexer 100 is created such that it can be switched from e.g. tap 3 back to tap zero, which obviously are not adjacent taps. As a tap selection progresses by each unit of delay D, the lower two bits of the count control value controlling tap selection within the 4:1 multiplexer 100 will roll-over multiple times: e.g. tap zero, tap one, tap two, three, zero, one, two, etc., each rollover occurring when a 4×D delay tap of the 8:1 multiplexer 88 is switched from a present tap to an adjacent tap. The delay at taps three and zero of the 4:1 multiplexer are not adjacent, because delay tap three has three units of delay D, and delay zero has no units of delay D. If the output of the 4:1 multiplexer 100 is delayed by three entire delays (3×D) to produce the clock MUX4CK on the path 94, it becomes practical to switch from one end (e.g. tap three) of the 4:1 multiplexer to the other end (e.g. tap zero) without causing a glitch in the resultant ring oscillator clocking signal on the path 54. This is because the propagation delays through the oscillator ring at the zero taps of both multiplexers 88 and 100 are much greater than the unit delays imposed by the 1–3 unit delay lines 102, 104 and 106 which are selected by the 4:1 multiplexer 100, acting as a delay vernier. The same condition does not hold for the 8:1 multiplexer 88, because the 32 delay units imposed by delays 110–122 are greater than propagation delay through the zero tap selected ring delay structure.

Since there are four taps along the 4:1 multiplexer 100, there are three series-connected unit delay (D) elements 102, 104, 106. The four taps of the 4:1 multiplexer 100 connect to the nodes between, and at the ends of, this D series delay network. Similarly, as there are eight taps along the 8:1 multiplexer 88, there are seven series-connected four times unit delays (4×D) 110, 112, 114, 116, 118, 120, and 122, and the eight taps connect to the nodes between, and at the ends of this 4×D series delay network. Thus, those skilled in the art will appreciate that the 4:1 multiplexer 100 provides a fine or incremental (vernier) delay adjustment, while the 8:1 multiplexer 88 provides for a coarse delay adjustment, each increment of adjustment being four times that of the 4:1 multiplexer 100.

The ring oscillator NAND structure 52 is shown somewhat differently in FIG. 2. In this more detailed view, the logical elements connected to form the ring oscillator include a digital inverter 108, the 8:1 multiplexer 88 (and zero to seven delay elements 4×D), the 4:1 multiplexer 100 (and zero to three unit delay elements D), an AND gate 124 which combines the feedback path 56 and the enable signal on the path 53 to trigger initial feedback oscillation. An OR gate 126 is also shown in the ring, in order to enable static testing of continuity through the circuit. A test-in value is applied over a line 125 leading to an input of the OR gate 126 for continuity testing purposes. An output from the ring oscillator 32A is taken on the path 54 from an output of the OR gate 126. Also connected to the OUT_CLK path 54 is a unit delay element 128 which leads to the input of the inverter stage 108, thereby completing the feedback path.

The unit delay 108 means that the ring oscillator loop cannot oscillate any faster than a signal can traverse the delay 128, inverter 108, multiplexer 88 (without any delays 110–122), multiplexer 100 (without any delays 102–106), AND gate 124 and OR gate 126. The longest delay path is provided when the 8:1 multiplexer 88 selects the eighth tap at the output of the delay, and the 4:1 multiplexer 100 selects the fourth tap at the output of the delay D 106 4×D 122, thereby imposing a total of 32 units of delay in series with the inverter 108.

Figure 3:
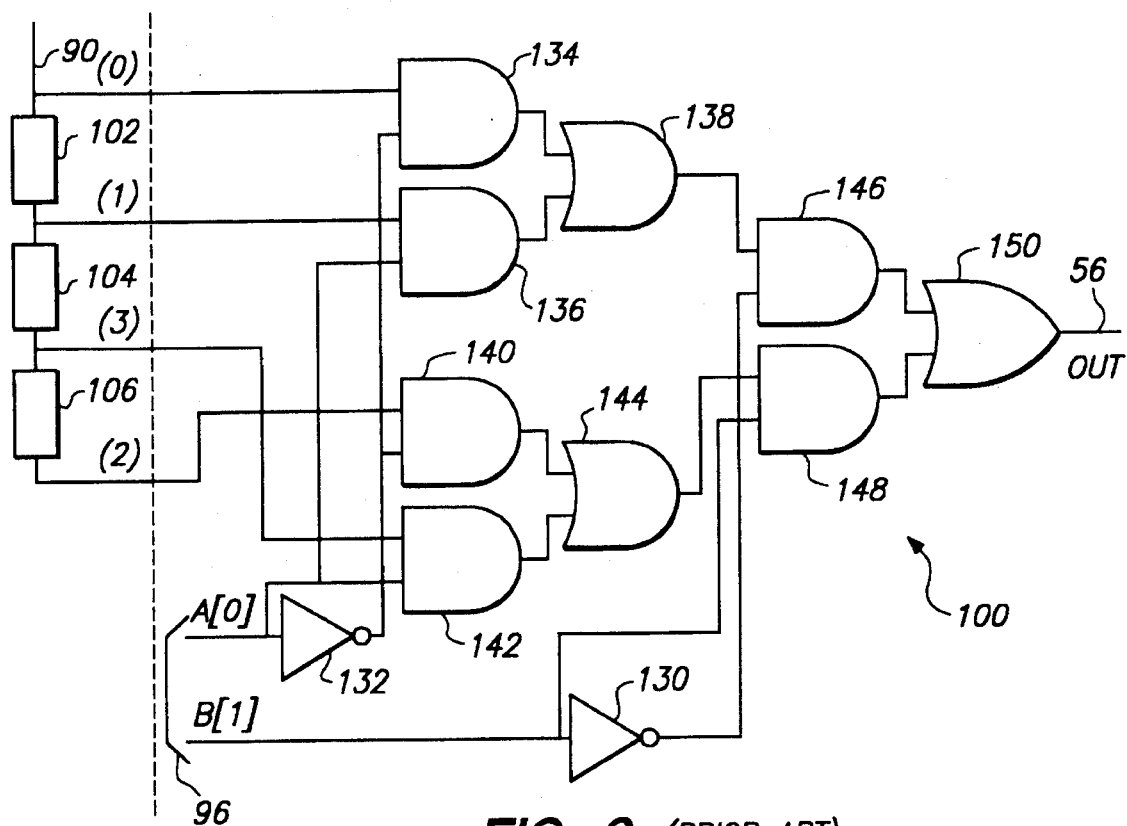
FIG. 3 a more detailed block diagram of a conventional 4:1 multiplexer element within the FIG. 2 adjustable delay line structure.

FIG. 3 illustrates an exemplary structure for the 4:1 multiplexer 100, which follows a conventional design. In the FIG. 3 multiplexer of FIG. 3, the two low order control lines [1] and [0] of the five bit control bus 96 enter inverter stages 130, and 132, respectively. In this example, there are three 2:1 multiplexer logic units: a first unit comprising two AND gates 134 and 136 and an OR gate 138; a second unit comprising two AND gates 140 and 142 and an OR gate 144, and a third unit, comprising two AND gates 146 and 148, and an OR gate 150. The first and second 2:1 multiplexer units feed into the third multiplexer unit, so that an output from the OR gate 150 provides the 4:1 output path 56 The lowest order bit position [0] of the control word controls input selection of both the first and second 2:1 multiplexer logical units, whereas the next bit position [1] of the control word on the path 96 controls the third 2:1 multiplexer unit which selects between outputs of the first two units and provides the output 56. The 8:1 multiplexer 88 may similarly be comprised of two 4:1 multiplexers and an additional output 2:1 logical unit.

The adjustable delay line function 55 selects which one of the many stages of the incorporated delay line will drive the input of the delay line, thereby closing the delay loop. At some point in time, while the output of the ring oscillator 32A on the path 54 is being used as a clock e.g. by the DRAM buffer controller 38, the loop delay will need adjustment in order to account for temperature or voltage-induced delay changes occurring within the adjustable delay function 55. The goal of the present invention is to enable the delay function 55 to be adjusted by transitioning from the present output waveform period to a new waveform period without creating any third waveform period (glitch) during this frequency transition. Thus, as used herein, the expression "glitch" means the presence of a pulse or spike present during the frequency transition interval which has a period lying outside of a range between the present output waveform period and the new waveform period; and, conversely, the term "glitchless" means that no glitch is present during the frequency transition interval.

The present invention accomplishes this goal by using a combination of two techniques. First, the present output of the adjustable delay line to be adjusted is used to synchronize the changing of the control lines of the multiplexers 88 and 100. If a constraint is applied that the change in taps to be made is to an adjacent delay stage only, either less delay or more delay, by a known or bounded adjustment increment, then the synchronized transition of the control lines to the multiplexers 88 and 100 can occur when the three possible delay selections (i.e. the current tap, the adjacent longer line tap, and the adjacent shorter line tap) are in a known state.

Second, conventional design of 2n to 1 multiplexer circuits connect each select control line to one or more 2:1 multiplexer units in parallel. The present invention enables a selection transition to be made between the state of the inputs of interest without inadvertently passing any other input state along to the output. If the control lines are constrained to transition one line per tap change to the multiplexer, then only one 2:1 multiplexer selection unit within the path leading to the delay output 56 will see a change. Further, if it is known that inputs of that particular 2:1 function are known and in desirable states, then no undesirable outputs will result therefrom. The ring oscillator design of the present invention achieves this constraint by encoding the binary tap-select code into a code where consecutive numerical values translate to control words separated by only one-bit transitions (a Gray-code control). Since a three-bit control is needed for the 8:1 multiplexer 88, and only a two-bit control is needed for the 4:1 multiplexer 100, the five-bit control word stored in the clock control register 58 is separated into the three high order bits which control tap selection within the 8:1 multiplexer 88, and the two low order bits which control tap selection within the 4:1 multiplexer 100, in accordance with the following exemplary Gray-code:

| Gray-Code Table | | | |
|---|---|---|---|
| 8:1 Multiplexer 88 | | 4:1 Multiplexer 100 | |
| (decimal) | (Binary Gray Code(b)) | (decimal) | (Binary GC (b)) |
| 0 | b000 | 0 | b00 |
| 1 | b001 | 1 | b01 |
| 2 | b011 | 2 | b11 |
| 3 | b010 | 3 | b10 |
| 4 | b110 | | |
| 5 | b111 | | |
| 6 | b101 | | |
| 7 | b100 | | |

The Gray-code is selected in reference to the particular multiplexer architecture. Put another way, the multiplexer must have an architecture such that when the state of one and only one control line changes, the only transitions involved are between electrically adjacent multiplexer units thereof.

Figure 4:
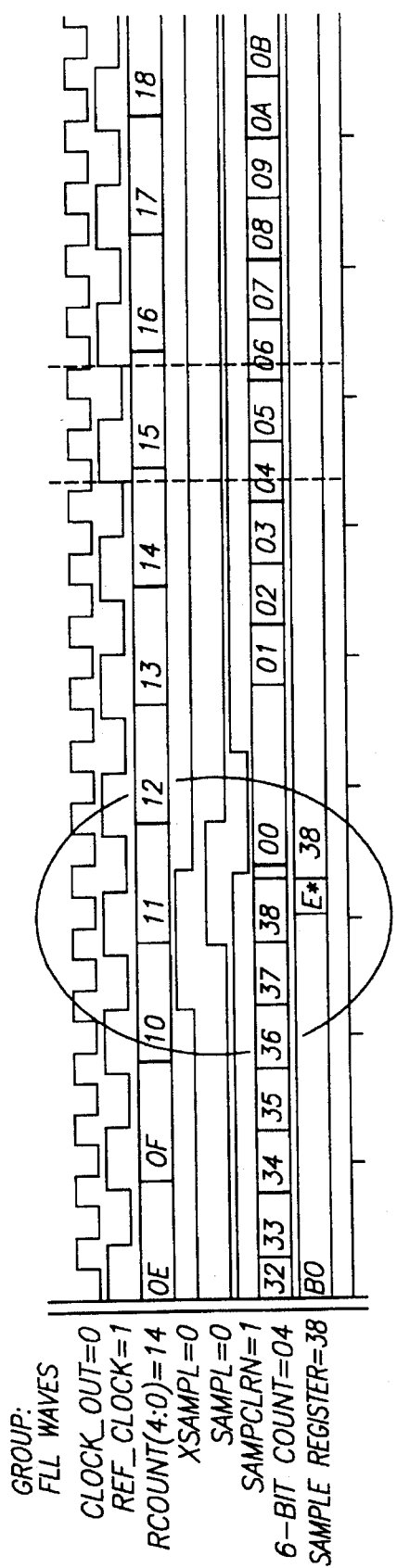
FIG. 4 is a series of waveform graphs upon a common time base illustrating operation of the ring oscillator clock out signal at a frequency above the reference clock frequency, and further illustrating operation of the sample register of the FIG. 1 ring oscillator circuit.
Figure 5:
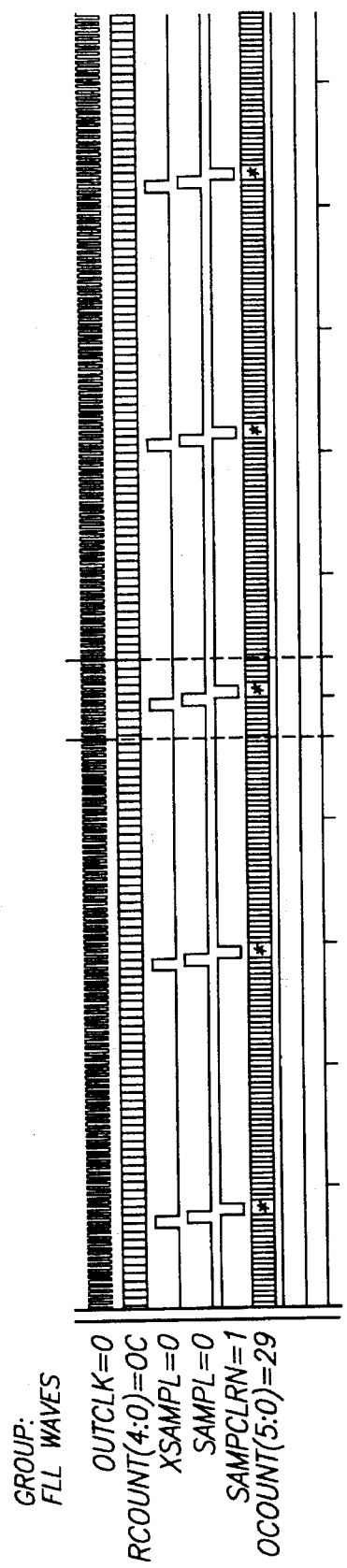
FIG. 5 is a series of waveform graphs upon a common time base longer than the time base of the FIG. 4 graphs, illustrating periodicity of the sampling function of the sample register.

FIG. 4 illustrates asynchronicity between the higher frequency ring oscillator CLOCK_OUT signal on the path 54, and the lower frequency REF_CLOCK on the path 37 from the crystal oscillator. The circled portion of FIG. 4 also illustrates three control signals XSAMP1, SAMP1 and SAMPCLRN. These three controls provide the timing needed to cause the sample register 64 to acquire a sample count, e.g. 38 (hex), followed shortly by clearing of the 6-bit sample counter 62. Thus, SAMP1 is provided over the control path 72 from the synchronization circuit 70 to cause the sample register 64 to latch the present count, while SAMPCLRN is provided over the path 74 to clear the counter 62. Once the sample count is latched into the sample register 64 it may then be read by the microprocessor 26. FIG. 5 shows the waveforms of FIG. 4 (except REF_CLOCK) on a longer time base, to illustrate the periodicity of latching the count into the sample register 64, so that it may then be polled by the microprocessor 26 and a correction calculated and applied.

Figure 6:
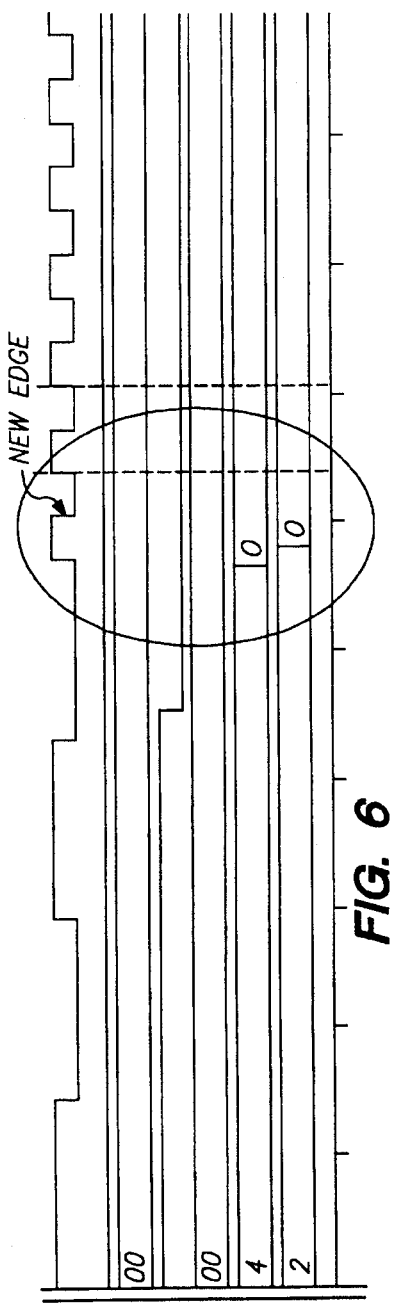
FIG. 6 is a series of waveform graphs upon a common time base illustrating glitchless switching of frequency of the FIG. 1 ring oscillator clock output from a first, slower frequency to a second, faster frequency.

FIG. 6 illustrates within the circled region thereof, a maximum frequency adjustment of the CLOCK_OUT signal, in which the frequency changes from the slowest setting to the fastest setting. In this example, the adjustment will be made e.g. one adjustment step at a time, so that in order to achieve a maximum range adjustment, several tap selection adjustment cycles will occur. Tap selection occurs after the tap selection value to adjust the delay line 55 has been loaded into the clock control register 58. When the tap selection value is loaded into the clock control register, a CHANGE control is automatically generated and asserted. A multiplexer tap gate window M4G is then generated, in accordance with a logic circuit described below in connection with FIG. 9. The 4×D delay 86 at the output of the 8:1 multiplexer 88 is provided as a "worst case delay" in order to delay the actual tap selection switching operation until the output logical condition of the 8:1 multiplexer 88 is (or will be) consistent with a logical level of the output which would be present if a switchover is made to an adjacent longer delay tap. In other words, without providing the "worst case delay" 86, it is possible that in switching in a longer delay path within the ring, an output would momentarily rise to one level and then immediately switch to its other, proper level, resulting in an unwanted high frequency pulse or spike ("glitch"). When the present logical state of the 8:1 multiplexer 88 is consistent with the logical states of the two adjacent tap positions thereof as assured by the 4×D worst case delay 86, a tap switch occurs, which is indicated as a bus change e.g. from one to zero as shown by the vertical bar and zero ("10") notation appearing in the 8to1 sel [2:0] waveform graph of FIGS. 7 and 8.

Similarly, the 3×D delay 98 at the output line 90 is provided to be sure that the output logical condition of the 4:1 multiplexer is consistent with what the output would be if the switchover to any tap position thereof would be. Any tap of the 4:1 multiplexer may be selected since the three possible unit delay periods provided by the fine vernier 4:1 delay line 100 would result in an incremental delay occurring within a 4×D period of the coarse adjustment delay line 88 The 3×D delay causes the 4:1 multiplexer tap selection to occur after the tap switch has occurred in the 8:1 multiplexer 88, as shown by the bus change zero to two ("12") notation in FIGS. 7 and 8 in the 4l to1sel[1:] waveform graph. However, since the 8:1 coarse delay multiplexer 88 and 4:1 fine vernier multiplexer 100 are independent of each other, switchover in both multiplexers could be simultaneous. When the present state and new tap states are consistent, a new edge (marked "New Edge" in FIG. 6) occurs in the CLOCK_OUT signal on the path 54 and marks the beginning of a repetitive square wave clocking waveform at a faster (or slower) clocking rate.

Figure 7:
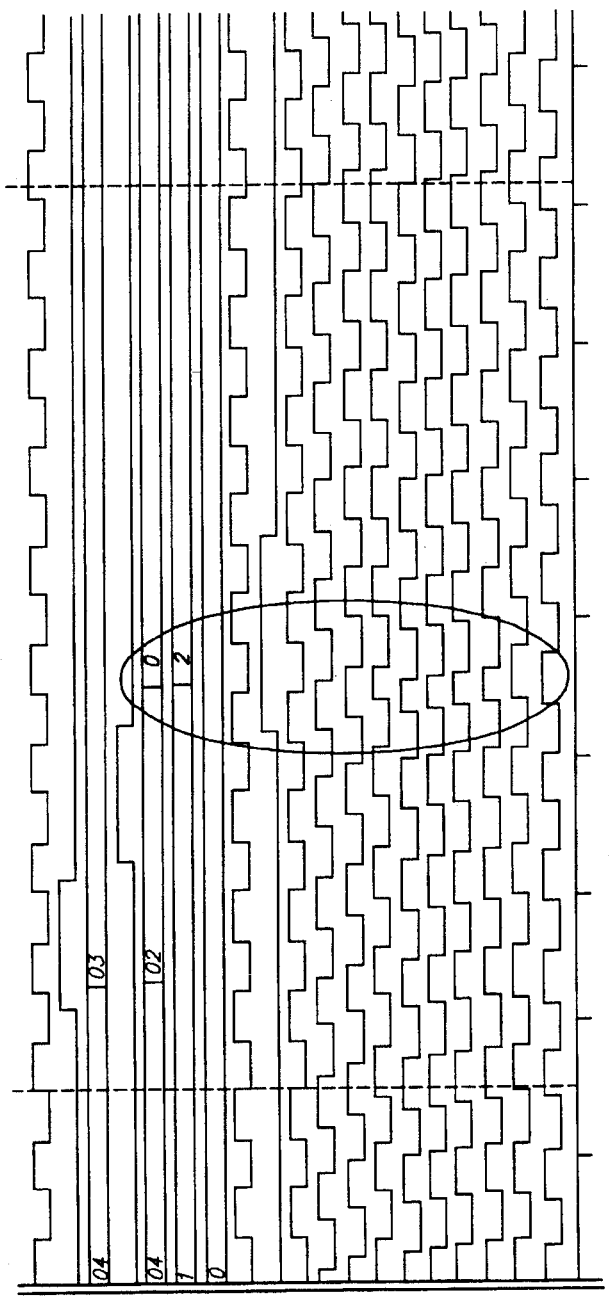
FIG. 7 is a series of waveform graphs upon a common time base illustrating synchronous control of the FIG. 2 adjustable delay line in a manner avoiding glitches and without interruption of clock output from the FIG. 1 ring oscillator.
Figure 8:
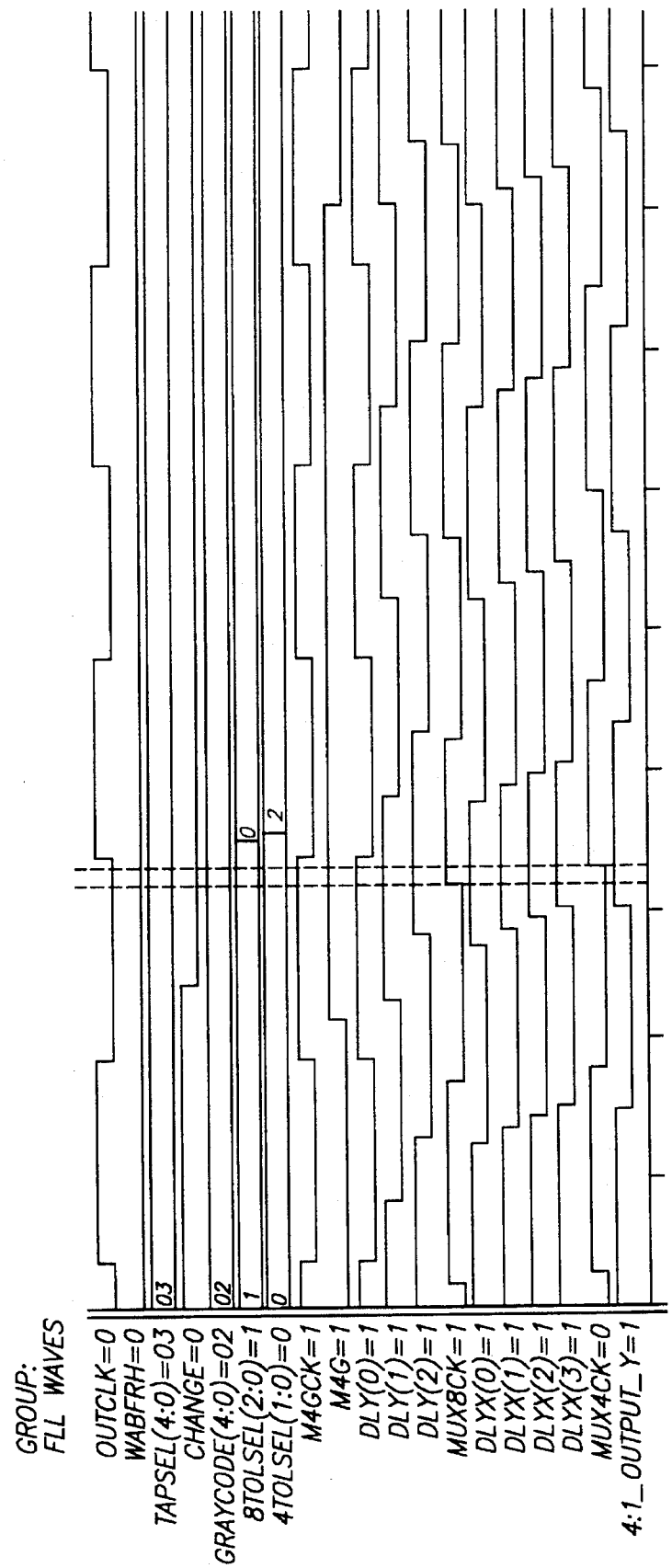
FIG. 8 is a series of waveform graphs upon a common time base shorter than the time base of FIG. 7 and constitutes an enlargement of a portion thereof.

FIGS. 7 and 8 illustrate the logical conditions which are determined to be present within the adjustable delay line structure 55 before a tap adjustment is asserted, in order to preclude generation of an unwanted glitch. In FIG. 7, a write to the clock control register 58 by the microprocessor 26 occurs when a write signal WSBFRH goes true. In the FIG. 7 example, the clock control register 58 has been holding a value of 04(hex), but after assertion of WSBFRH holds a value of 03(hex). This results in a tap adjustment signal being put out by the clock control register 58. The tap adjustment value (04(h) to 03(h)) is then Gray coded by the Gray code logic 60 into a new value (04(h) to 02(h), and it also causes the CHANGE control signal to be asserted. The CHANGE control signal becomes synchronized with the MUX4 clock (which is a logical inversion of the CLOCK_OUT signal. This leads to creation of a signal M4G which enables the 8:1 multiplexer 88 and the 4:1 multiplexer 100 to change tap values. Before the change, the 8:1 multiplexer tap value on the control path 84 was a 1(h), and is changed to a zero(h) at the change. Similarly, before the change the 4:1 multiplexer tap value on the control path 96 was zero(h) and afterward becomes 2(h). (Note that a 1 to zero transition is a single bit change, and a zero to 2 bit change also results in a single bit Gray-coded change).

It is important to successful operation of the present invention that the multiplexer tap changes are made when the clock waveforms of the current tap position, the one longer tap position, and the one shorter tap position are all at (or are transitioning to) the same level, such that they are in a balanced state at the moment of tap switch. These levels could be high or low, but they are at the level of the CLOCK_OUT signal, or are at a desired level. Thus, the transition from the current tap to the next tap, via the internal circuit paths of the affected multiplexer, will always result in one of the two desirable outputs. Put another way, if the tap switch time were not controlled, a waveform could result which, for example, rises on the current tap, switches to the longer tap when that signal is still low, and then rises again with the longer tap, resulting in an undesirable high-low-high transition ("glitch").

Thus, in FIG. 8, two vertical dashed lines are imposed on the family of waveforms which represent an enlarged time base of the graphs shown in FIG. 7 at the switchover region circled in FIG. 7. The left vertical dashed line coincides with the rising edge of the MUX8CK clock on the path 82. The three taps of the 8:1 multiplexer 88 that are potentially affected by the switch value are dly[0], dly[1] and dly[2] These levels are all at a logical high level at the time of the left vertical dashed line. While it is not important whether these levels are high or low, what is important is that they are the same at the rising edge of the MUX8CK signal.

With regard to the 4:1 multiplexer 100, FIG. 8 also shows that a right vertical dashed line coincident with the MUX4CK signal on the path 96. This graph shows that at the time of the MUX4CK rising edge, all four of the tap positions of the 4:1 multiplexer 100, dlyx[0–3], are at logical high levels, so that switching between any of the taps of the 4:1 multiplexer 100 will not result in any glitch in the ring oscillator CLOCK_OUT signal stream on the path 54.

In a fully synchronous system, the clock control register 58 would be implemented as a clocked register which would only present valid tap selection values at its output. In such an arrangement all of the circuitry downstream of the register 58 would not have to be protected against invalid data. In the presently preferred embodiment, the register 58 is implemented as a "transparent" register in order to reduce gate count within the ASIC 28. In order to use a gate-count-reduced structure, a control gating mechanism must be provided. The MUX4GATE signal graphed in FIGS. 7 and 8 as "M4G" provides the needed control gating mechanism and is generated within a gating circuit which forms one implementation of the synchronization circuits 80 and 92. An exemplary circuit is illustrated in FIG. 9.

Figure 9:
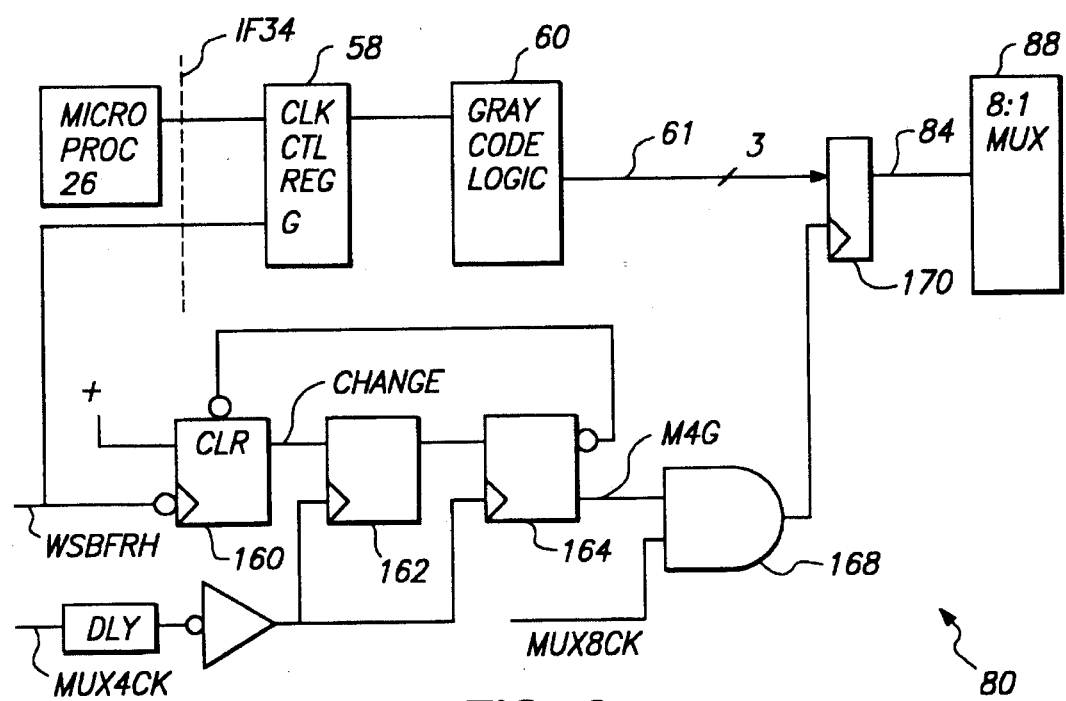
FIG. 9 is a logic block diagram for generating a MUX4GATE signal illustrated as one of the waveforms graphed in FIGS. 7 and 8.

In FIG. 9, when the microprocessor 26 writes a tap control value to the clock control register 58, a control WSBFRH signal is asserted to enable the register 58. This WSBFRH signal, graphed in FIGS. 7 and 8, also clocks a flip-flop 160. An output from the flip-flop 160 provides the CHANGE signal, also graphed in FIGS. 7 and 8. CHANGE is also asynchronous with respect to the CLOCK_OUT signal, graphed in FIGS. 7 and 8 as "outclk". Two flip-flops 162 and 164 are connected in tandem and are commonly clocked by the synchronous M4GCK signal. The flip-flops 162 and 164 are connected as shown in FIG. 9, and an inverting output of the flip-flop 164 is fed back to reset the flip-flop 160. The non-inverting output of the flip-flop 164 provides the MUX4GATE signal. This signal is then combined with the MUX8CK signal in an AND gate 168 to develop a synchronization control signal which is used to enable a latch 170, which passes the tap selection value to the 8:1 multiplexer 88 over the control path 89. A similar AND gate and latch are provided to synchronize the MUX4GATE and MUX4CK signal thereby to synchronize passage of the vernier tap selection value to the 4:1 multiplexer 100 over the control path 96.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A glitchless frequency adjustable clock generation circuit comprising:

a reference clock putting out a stable reference clocking signal, a digital ring oscillator including a series circuit loop of at least one inverting gate, a delay line comprised of plural delays formed of digital transmission gates connected in series in a path between an output and an input of the inverting gate, there being a series of taps along the plurality of digital transmission gates, and a clock output for providing a present, adjustable clocking signal, the programmable delay line comprising at least a first multiplexer for selecting among the series of taps in accordance with a present tap selection value, clock monitoring circuitry connected to compare the clock output with the stable reference clocking signal and to produce a digital clock cycle count for each comparison made, programmed microcontroller means connected to receive the digital clock cycle count and to generate and put out a new tap selection value for controlling tap selection of the first multiplexer as a function of the digital clock cycle count and a desired clock output frequency set point, and synchronization means connected to the programmed microcontroller means and to the digital ring oscillator for synchronizing and applying the new tap selection value to the first multiplexer in relation to the present, adjustable clocking signal, and to a logical state of a successor, adjustable clocking signal to be put out by the digital ring oscillator following application of the new tap selection value without generating a glitch during multiplexer tap switching.

2. The glitchless clock generation circuit set forth in claim 1 further comprising a Gray code encoding circuit in a control path between the programmed microcontroller and the synchronization means for encoding the control value as a Gray code so that the new tap selection value applied to control the programmable delay line means differs from the present tap selection value by a single bit variation.

3. The glitchless clock generation circuit set forth in claim 1 wherein the reference clock comprises a crystal resonator for regulating oscillation frequency of a crystal oscillator connected to the crystal resonator for generating and putting out the stable reference clocking signal.

4. The glitchless clock generation circuit set forth in claim 3 wherein the reference clock generates a stable digital reference frequency signal at a frequency of 4x, and wherein the ring oscillator generates the clock output as a digital signal having a frequency of $5 \times \pm i$, wherein x is an integer, and i equals a range of frequency adjustment of the programmable delay line means in response to each tap selection value.

5. The glitchless clock generation circuit set forth in claim 1 wherein the clock monitoring circuitry includes a first counter clocked by the adjustable clocking signal of the clock output, and a second counter clocked by the stable digital reference frequency signal for counting to a predetermined sample count, a sync circuit clocked by the sample count to provide a sample register clocking signal, and a sample register connected to the first counter for latching a count reached by the first counter in response to the sample register clocking signal, the sample register providing the latched count as the digital clock cycle count to the programmed microcontroller means.

6. The glitchless clock generation circuit set forth in claim 1 wherein the digital ring oscillator series circuit loop including the delay line comprised of plural delays formed of digital transmission gates, the first multiplexer for selecting among the series of taps, and the synchronization means are formed as a circuit within an application specific integrated circuit, and further comprising microprocessor interface means enabling the application specific integrated circuit to be operatively interconnected with the microprocessor.

7. The glitchless, frequency adjustable clock generation circuit set forth in claim 2 wherein the first multiplexer comprises an electrically connected array of multiplexer switching elements, and the Gray-coded tap select control value selects two electrically adjacent multiplexer switching elements of the first multiplexer.

8. A clock generation circuit including:
   a reference clock putting out a stable reference clocking signal,
   a digital ring oscillator comprising:
      a series circuit loop of at least one inverting gate,
      a first delay line comprised of plural delays formed of digital transmission gates connected in series in a path between an output and an input of the inverting gate, and a clock output for providing a present adjustable clocking signal,
      a first multiplexer connected to taps along the first delay line for providing a coarse delay adjustment, and further comprising
      a second delay line formed of plural digital transmission gates in series with the first delay line within the series circuit loop and
      a second multiplexer connected to taps along the second delay line for providing a fine delay adjustment,
   clock monitoring circuitry connected to compare the clock output with the stable reference clocking signal and to produce a digital clock cycle count for each comparison made,
   programmed microcontroller means connected to receive the digital clock cycle count and to generate and put out a new tap selection value for controlling tap selection of the first multiplexer as a function of the digital clock cycle count and a desired clock output frequency set point, and
   synchronization means connected to the programmed microcontroller means and to the digital ring oscillator for synchronizing and applying the new tap selection value to the first multiplexer and to the second multiplexer in relation to the present, adjustable clocking signal, and to a logical state of a successor, adjustable clocking signal to be put out by the digital ring oscillator following application of the new tap selection value, the synchronization means providing a first control path for controlling tap selection in the first multiplexer, and for providing a second control path for controlling tap selection in the second multiplexer.

9. The clock generation circuit set forth in claim 8 wherein each one of the plural delays formed of digital transmission gates of the first delay line comprises a series of digital transmission gates to provide an n times delay of a unit delay D where n is an integral multiple, and wherein each delay interval between taps of the second delay line provides a unit delay D.

10. A clock generation circuit for generating a plurality of adjustable clocking signals including:
   a reference clock putting out a stable reference clocking signal,
   a plurality of digital ring oscillators, each ring oscillator being formed within an application specific integrated circuit and comprising:
      a series circuit loop of at least one inverting gate,
      a delay line comprised of plural delays formed of digital transmission gates connected in series in a path between an output and an input of the inverting gate, and a clock output for providing a present, adjustable clocking signal,
      a multiplexer connected to taps along the delay line for selecting among the taps, and
      clock monitoring circuitry connected to compare the clock output with the stable reference clocking signal and to produce a digital clock cycle count for each comparison made, and
      synchronization means connected to the digital ring oscillator for synchronizing and applying a new tap selection value to the multiplexer in relation to the present, adjustable clocking signal, and to a logical state of a successor, adjustable clocking signal to be put out by the digital ring oscillator following application of the new tap selection value,
   the application specific integrated circuit including a microprocessor interface means for connecting a supervisory programmed microcontroller to each one of the digital ring oscillators for enabling the application specific integrated circuit to be operatively interconnected with the supervisory programmed microcontroller,
   the supervisory programmed microcontroller being connected to the microprocessor interface means for receiving periodically from each ring oscillator the digital clock cycle count thereof and for periodically generating and putting out a new tap selection value for controlling tap selection of the first multiplexer as a function of the digital clock cycle count and a desired clock output frequency set point.

11. The clock generation circuit set forth in claim 10 further comprising within each said digital ring oscillator a clock control register for holding the tap selection value for said oscillator and operatively connected to the microprocessor via the microprocessor interface means such that when the microprocessor writes the tap selection value to the clock control register for said oscillator, the synchronization means of said oscillator becomes operative to synchronize tap selection of the multiplexer of said oscillator in relation to the present, adjustable clocking signal, and to the logical state of a successor, adjustable clocking signal to be put out by said oscillator following application of the new tap selection value to the control register thereof.

12. A glitchless, frequency adjustable ring oscillator circuit formed as one of a plurality of functions within a large scale digital integrated circuit and including an external reference frequency resonator means and a programmed digital microprocessor for controlling adjustment of frequency of the adjustable ring oscillator circuit, the large scale digital integrated circuit comprising:

a reference clock connected to the external reference frequency resonator for generating and putting out a stable reference clocking signal, a series circuit loop of at least one inverting gate, a programmable delay line comprised of plural delays formed of digital transmission gates connected in series in a path between an output and an input of the inverting gate, there being a series of taps along the plurality of digital transmission gates, and a ring oscillator clock output for providing a present, adjustable clocking signal, at least a first multiplexer for selecting among the series of taps in accordance with a tap select control value, clock monitoring circuitry connected to compare the clock output with the stable reference clocking signal and to produce a digital clock cycle count for each comparison made, a synchronization circuit for generating and applying to the first multiplexer a tap switching control signal for synchronizing the tap select control value from the programmed digital microprocessor with the present, adjustable clocking signal, and with a logical state of a successor, adjustable clocking signal to be put out by the digital ring oscillator following the tap selection without generating a glitch during multiplexer tap switching, and an interface for connecting the integrated circuit with the programmed digital microprocessor, the programmed digital microprocessor connected to the large scale integrated circuit via the interface and being programmed periodically to receive the digital clock cycle count and to generate and supply the tap select control value for controlling tap selection of the first multiplexer via the interface to the synchronization circuit, the tap select control value being developed by the microprocessor as a function of the digital clock cycle count and a programmed clock output frequency set point.

13. The glitchless, frequency adjustable ring oscillator circuit set forth in claim 12 wherein the external reference frequency resonator comprises a crystal.

14. The glitchless, frequency adjustable ring oscillator circuit set forth in claim 12 wherein the clock monitoring circuitry includes a first counter clocked by the adjustable clocking signal of the ring oscillator clock output, and a second counter clocked by the stable digital reference clocking signal for counting to a predetermined sample count, a sync circuit clocked by the sample count to provide a sample register clocking signal, and a sample register connected to the first counter for latching a count reached by the first counter in response to the sample register clocking signal, the sample register providing the latched count as the digital clock cycle count to the programmed microcontroller means via the interface.

15. The glitchless, frequency adjustable ring oscillator circuit set forth in claim 12 further comprising Gray code logic circuitry for Gray-coding the tap select control value into a Gray-coded tap select control value prior to application to the first multiplexer, the first multiplexer being connected to select adjacent taps in accordance with a Gray code of the Gray-coded tap select control value.

16. The glitchless, frequency adjustable ring oscillator circuit set forth in claim 15 wherein the first multiplexer comprises an electrically connected array of multiplexer switching elements, and the Gray-coded tap select control value selects two electrically adjacent multiplexer switching elements of the first multiplexer.

17. An adjustable ring oscillator circuit formed as one of a plurality of functions within a large scale digital integrated circuit and including an external reference frequency resonator means and a programmed digital microprocessor for controlling adjustment of frequency of the adjustable ring oscillator circuit, the large scale digital integrated circuit comprising:

a reference clock connected to the external reference frequency resonator for generating and putting out a stable reference clocking signal, a series circuit loop of at least one inverting gate, a first programmable multi-tap delay line and a second programmable multi-tap delay line in a path between an output and an input of the inverting gate, and a ring oscillator clock output for providing a present, adjustable clocking signal, a first multiplexer for selecting among taps of the first programmable multi-tap delay line, and a second multiplexer for selecting among taps of the second programmable multi-tap delay line, clock monitoring circuitry connected to compare the clock output with the stable reference clocking signal and to produce a digital clock cycle count for each comparison made, the first delay line being formed of groups of plural transmission gates connected in tandem, each group providing a delay equal to an integral multiple of a unit delay period D, to which the first multiplexer is connected to provide a coarse delay adjustment, and the second delay line being formed of plural digital transmission gates in series with the first delay line within the series circuit loop, the second delay line digital transmission gates providing a unit delay period D between taps, and a second multiplexer connected to the taps along the second delay line for providing a fine delay adjustment, a synchronization circuit providing a first synchronized control path for controlling tap selection in the first multiplexer, and providing a second synchronized control path for controlling tap selection in the second multiplexer for synchronizing the tap select control value from the programmed digital microprocessor with the present, adjustable clocking signal, and with a logical state of a successor, adjustable clocking signal to be put out by the digital ring oscillator following the tap selection, and an interface for connecting the integrated circuit with the programmed digital microprocessor, the programmed digital microprocessor connected to the large scale integrated circuit via the interface and being programmed periodically to receive the digital clock cycle count and to generate and supply the tap select control value for controlling tap selection of the first multiplexer via the interface to the synchronization circuit, the tap select control value being developed by the microprocessor as a function of the digital clock cycle count and a programmed clock output frequency set point.

18. An adjustable ring oscillator circuit formed as one of a plurality of functions within a large scale digital integrated circuit and including an external reference frequency resonator means and a programmed digital microprocessor for controlling adjustment of frequency of the adjustable ring oscillator circuit, the large scale digital integrated circuit comprising:

a reference clock connected to the external reference frequency resonator for generating and putting out a stable reference clocking signal, a series circuit loop of at least one inverting gate, a programmable delay line comprised of plural delays formed of digital transmission gates connected in series in a path between an output and an input of the inverting gate, there being a series of taps along the plurality of digital transmission gates, and a ring oscillator clock output for providing a present, adjustable clocking signal, at least a first multiplexer for selecting among the series of taps in accordance with a tap select control value, clock monitoring circuitry connected to compare the clock output with the stable reference clocking signal and to produce a digital clock cycle count for each comparison made, a synchronization circuit for generating and applying to the first multiplexer a tap switching control signal for synchronizing the tap select control value from the programmed digital microprocessor with the present, adjustable clocking signal, and with a logical state of a successor, adjustable clocking signal to be put out by the digital ring oscillator following the tap selection, the synchronization circuit including a plurality of flip-flops, there being a first flip-flop clocked in synchronism with the tap select control value supplied by the programmed microprocessor, and at least a second flip-flop clocked in synchronism with the present, adjustable clocking signal, for generating the tap switching control signal, and a control gate controlled by the tap switching control signal for gating the tap select control value to the first multiplexer, and an interface for connecting the integrated circuit with the programmed digital microprocessor, the programmed digital microprocessor connected to the large scale integrated circuit via the interface and being programmed periodically to receive the digital clock cycle count and to generate and supply the tap select control value for controlling tap selection of the first multiplexer via the interface to the synchronization circuit, the tap select control value being developed by the microprocessor as a function of the digital clock cycle count and a programmed clock output frequency set point.

* * * * *